(12) United States Patent
Hwang et al.

(10) Patent No.: US 12,040,327 B2
(45) Date of Patent: Jul. 16, 2024

(54) THREE-DIMENSIONAL SEMICONDUCTOR DEVICE HAVING VERTICAL MISALIGNMENT

(71) Applicant: SAMSUNG ELECTRONICS CO., LTD., Suwon-si (KR)

(72) Inventors: Inchan Hwang, Schenectady, NY (US); Seunghyun Song, Albany, NY (US); Byounghak Hong, Latham, NY (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 429 days.

(21) Appl. No.: 17/500,618

(22) Filed: Oct. 13, 2021

(65) Prior Publication Data

US 2023/0046885 A1    Feb. 16, 2023

Related U.S. Application Data

(60) Provisional application No. 63/231,967, filed on Aug. 11, 2021.

(51) Int. Cl.
 *H01L 27/092* (2006.01)
 *H01L 21/02* (2006.01)
 (Continued)

(52) U.S. Cl.
 CPC ...... *H01L 27/0922* (2013.01); *H01L 21/0259* (2013.01); *H01L 21/823807* (2013.01);
 (Continued)

(58) Field of Classification Search
 CPC ............. H01L 27/0922; H01L 21/0259; H01L 21/823807; H01L 21/823871;
 (Continued)

(56) References Cited

U.S. PATENT DOCUMENTS 8,115,511 B2    2/2012    Or-Bach
8,154,910 B2    4/2012    Park et al.
(Continued)

FOREIGN PATENT DOCUMENTS

WO    2019/132863 A1    7/2019

OTHER PUBLICATIONS

Specification for U.S. Appl. No. 63/231,967 (Year: 2021).*
(Continued)

*Primary Examiner* — J. E. Schoenholtz
(74) *Attorney, Agent, or Firm* — Sughrue Mion, PLLC

(57) ABSTRACT

A multi-stack semiconductor device includes: a lower-stack transistor structure including a lower active region and a lower gate structure, the lower active region including a lower channel structure, and the lower gate structure surrounding the lower channel structure; an upper-stack transistor structure vertically stacked above the lower-stack transistor structure, and including an upper active region and an upper gate structure, the upper active region including an upper channel structure, and the upper gate structure surrounding the upper channel structure; and at least one gate contact plug contacting a top surface of the lower gate structure, wherein the lower gate structure and the upper gate structure have a substantially same size in a plan view, and wherein the lower gate structure is not entirely overlapped by the upper gate structure in a vertical direction.

20 Claims, 7 Drawing Sheets

(51) Int. Cl.
*H01L 21/8238* (2006.01)
*H01L 23/535* (2006.01)
*H01L 29/06* (2006.01)
*H01L 29/423* (2006.01)
*H01L 29/66* (2006.01)
*H01L 29/786* (2006.01)

(52) U.S. Cl.
CPC .... *H01L 21/823871* (2013.01); *H01L 23/535* (2013.01); *H01L 27/0924* (2013.01); *H01L 29/0665* (2013.01); *H01L 29/42392* (2013.01); *H01L 29/66742* (2013.01); *H01L 29/78696* (2013.01)

(58) Field of Classification Search
CPC ............... H01L 23/535; H01L 27/0924; H01L 29/0665; H01L 29/42392; H01L 29/66742; H01L 29/78696; H01L 21/823437; H01L 21/823828; H01L 29/0673; H01L 29/775; H01L 21/8221; H01L 21/823475; H01L 21/823431; H01L 27/0886; H01L 27/0688; H01L 29/42372; B82Y 10/00
See application file for complete search history.

(56) References Cited

U.S. PATENT DOCUMENTS

| | | | |
|---|---|---|---|
| 8,664,042 | B2 | 3/2014 | Or-Bach et al. |
| 8,754,533 | B2 | 6/2014 | Or-Bach et al. |
| 9,219,005 | B2 | 12/2015 | Or-Bach et al. |
| 9,672,873 | B2 | 6/2017 | Yamamoto et al. |
| 10,083,963 | B2 | 9/2018 | Goktepeli et al. |
| 10,593,681 | B1 | 3/2020 | Rubin |
| 2019/0214469 | A1 | 7/2019 | Paul et al. |
| 2020/0066683 | A1 | 2/2020 | Kim et al. |
| 2020/0135735 | A1* | 4/2020 | Sengupta .......... H01L 29/78696 |
| 2020/0144264 | A1 | 5/2020 | Li et al. |
| 2020/0327273 | A1 | 10/2020 | Peng et al. |
| 2023/0035444 | A1* | 2/2023 | Liaw ..................... H01L 23/528 |

OTHER PUBLICATIONS

Communication dated Sep. 27, 2022 issued by the European Patent Office in European Patent Application No. 22169894.7.
European Search Report dated Sep. 27, 2022 issued by the European Patent Office in Application No. 22169894.7.

* cited by examiner

THREE-DIMENSIONAL SEMICONDUCTOR DEVICE HAVING VERTICAL MISALIGNMENT

CROSS-REFERENCE TO THE RELATED APPLICATION

This application is based on and claims priority from U.S. Provisional Application No. 63/231,967 filed on Aug. 11, 2021 in the U.S. Patent and Trademark Office, the disclosure of which is incorporated herein in its entirety by reference.

BACKGROUND

1. Field

Apparatuses and methods consistent with example embodiments of the inventive concept relate to a three-dimensional (3D) semiconductor device, more particularly, to a multi-stack semiconductor device in which two or more transistor structures are vertically stacked in an intentional misalignment form.

2. Description of the Related Art

A multi-stack semiconductor device has been developed as a 3D semiconductor device by vertically stacking one or more transistor structures to achieve a higher device density. For example, two nanosheet structures of a p-type field-effect transistor (PFET) and an n-type FET (NFET) may be stacked at a lower stack and an upper stack, respectively, to from a higher-density 3D complementary metal-oxide semiconductor (CMOS) device.

However, the inventors of the present invention have learned that there are many challenges to overcome in stacking transistor structures to achieve the multi-stack semiconductor device. For example, it is very difficult to form and land contact plugs on a gate structure and source/drain regions of a lower-stack transistor structure without sacrificing an area gain when an upper-stack transistor structure is stacked above the lower-stack transistor structure.

FIG. 1A illustrates a top a plan view of a plurality of multi-stack semiconductor devices in a related art, and FIG. 1B illustrates a cross-sectional view of the multi-stack semiconductor devices shown in FIG. 1A taken along a line I-I' shown therein.

Referring to FIGS. 1A and 1B, a plurality of multi-stack semiconductor devices 100 are arranged on a substrate (not shown) to include a lower-stack transistor structure 105 and an upper-stack transistor structure 115, which may respectively form a lower-stack transistor and an upper-stack transistor when completed. The lower-stack transistor structure 105 includes a lower active region, in which a lower channel structure 105C and lower source/drain regions (not shown) are formed, and a lower gate structure 105G surrounding the lower channel structure 105C. Similarly, the upper-stack transistor structure 115 includes an upper active region, in which an upper channel structure 115C and upper source/drain regions 115SD are formed, and an upper gate structure 115G surrounding the upper channel structure 115C. Further, a gate contact plug 120 is formed to connect the lower gate structure 105G and the upper gate structure 115G to a power source or another circuit element through a back-end-of-line (BEOL) structure (not shown) that may be formed above the upper-stack transistor structure 115. The two gate structures 105G and 115G may also be connected to each other through the gate contact plug 120, respectively, to form a common gate structure of at least one of the multi-stack semiconductor devices 100.

Here, it is noted that at least a portion of the gate contact plug 120 extended from the above-disposed BEOL structure is bent at a side of the lower gate structure 105G for lateral connection to the lower gate structure 105G, as shown in FIGS. 1A and 1B. This is because the lower-stack transistor structure 105 and the upper-stack transistor structure 115 generally have a substantially same size of active region and gate structure, and thus, there is no space for the gate contact plug 120 to directly land on a top surface of the lower gate structure 105G. Thus, there is at least a loss of an area gain in forming the multi-stack semiconductor device 100 when the bent gate contact plug 105G is formed. Further, the formation processes for the lateral region of gate contact plug 120 may be difficult or defect prone. To address the above problem of the multi-stack semiconductor device 100, a different contact gate contact plug may be connected to gate structures of a multi-stack semiconductor device.

FIG. 2A illustrates a top a plan view of a plurality of different multi-stack semiconductor devices in a related art, and FIG. 2B illustrates a cross-sectional view of the multi-stack semiconductor devices shown in FIG. 2A taken along a line I-I' shown therein.

Referring to FIGS. 2A and 2B, a lower-stack transistor structure 205 and an upper-stack transistor structure 215 forming a multi-stack semiconductor devices 200 respectively include the same elements included in the lower-stack transistor structure 105 and the upper-stack transistor structure 115 shown in FIGS. 1A and 1B. Thus, a lower-stack transistor structure 205, a lower active region including a lower channel structure 205C and lower source/drain regions (not shown), a lower gate structure 205G, an upper-stack transistor structure 215, an upper active region 215A, an upper channel structure 215C, upper source/drain regions 215SD, and an upper gate structure 215G are the same as the corresponding elements included in the multi-stack semiconductor devices 100. However, a gate contact plug 220 is structured differently from the gate contact plug 120.

The gate contact plug 220 is formed to penetrate into the two gate structures 205G and 215G to save an area gain provided by the multi-stack semiconductor devices 200. However, this structure also has a problem in that the size of two gate structures 205G and 215G need to be bigger than that of the two gate structures 105G and 115G to provide a space for the gate contact plug 220 to penetrate as shown in FIGS. 2A and 2B. Further, the manufacturing process of the multi-stack semiconductor device 200 becomes more complicated than that of the multi-stack semiconductor device 100 at least because an additional step of etching the two gate structures 205G and 215G to provide the space for the gate contact plug 220 to penetrate the two gate structures 205G and 215G.

Thus, there is demand of an improved structure of a multi-stack semiconductor device in the field.

Information disclosed in this Background section has been learned by the inventors before achieving the embodiments of the present application or is technical information acquired in the process of achieving the embodiments described herein. Therefore, it may contain information that does not form prior art that is already known to the public.

SUMMARY

The disclosure provides a multi-stack semiconductor device which is formed by wafer-bonding an upper-stack transistor structure to a lower-stack transistor structure such that the upper-stack transistor structure is vertically misaligned with respect to the lower-stack transistor structure.

According to embodiments, there is provided a multi-stack semiconductor device which may include: a lower-stack transistor structure including a lower active region and a lower gate structure, the lower active region including a lower channel structure, and the lower gate structure surrounding the lower channel structure; an upper-stack transistor structure vertically stacked above the lower-stack transistor structure, and including an upper active region and an upper gate structure, the upper active region including an upper channel structure, and the upper gate structure surrounding the upper channel structure; and at least one gate contact plug contacting a top surface of the lower gate structure, wherein the lower gate structure and the upper gate structure have a substantially same size in a plan view, and the lower gate structure is not entirely overlapped by the upper gate structure in a vertical direction According to embodiments, there is provided a multi-stack semiconductor device which may include: a lower-stack transistor structure including a lower active region and a lower gate structure, the lower active region including a lower channel structure, and the lower gate structure surrounding the lower channel structure; an upper-stack transistor structure vertically stacked above the lower-stack transistor structure, and including an upper active region and an upper gate structure, the upper active region including an upper channel structure, and the upper gate structure surrounding the upper channel structure; at least one gate contact plug contacting a top surface of the lower gate structure, wherein the lower gate structure and the upper gate structure have a same size in a plan view, and the upper gate structure is formed to have a predetermined offset with respect to the lower gate structure in at least one of a first direction and a second direction in the plan view, the first direction and the second direction being perpendicular to a vertical direction.

According to embodiments, there is provided a method of manufacturing a multi-stack semiconductor device. The method may include: forming a lower-stack transistor structure comprising a lower gate structure, and an upper-stack transistor structure comprising an upper gate structure; stacking the upper-stack transistor structure on the upper-stack transistor structure by wafer-bonding such that the upper gate structure is formed to have a predetermined offset with respect to the lower gate structure in at least one of a first direction and a second direction in a plan view, the first direction and the second direction being perpendicular to a vertical direction; and connecting a gate contact plug directly on a top surface of the lower gate structure through a space provided by the predetermined offset between the lower gate structure and the upper gate structure.

Due to the above embodiments of misalignment between a lower-stack transistor structure and an upper-stack transistor structure, a multi-stack semiconductor device including the two transistor structures may be formed such that a gate contact plug vertically lands on a top surface of the lower gate structure to save an area gain provided by the multi-stack semiconductor device in a simplified manufacturing process.

BRIEF DESCRIPTION OF THE DRAWINGS

Example embodiments of the disclosure will be more clearly understood from the following detailed description taken in conjunction with the accompanying drawings in which.

DETAILED DESCRIPTION OF THE EMBODIMENTS

Figure 1A:
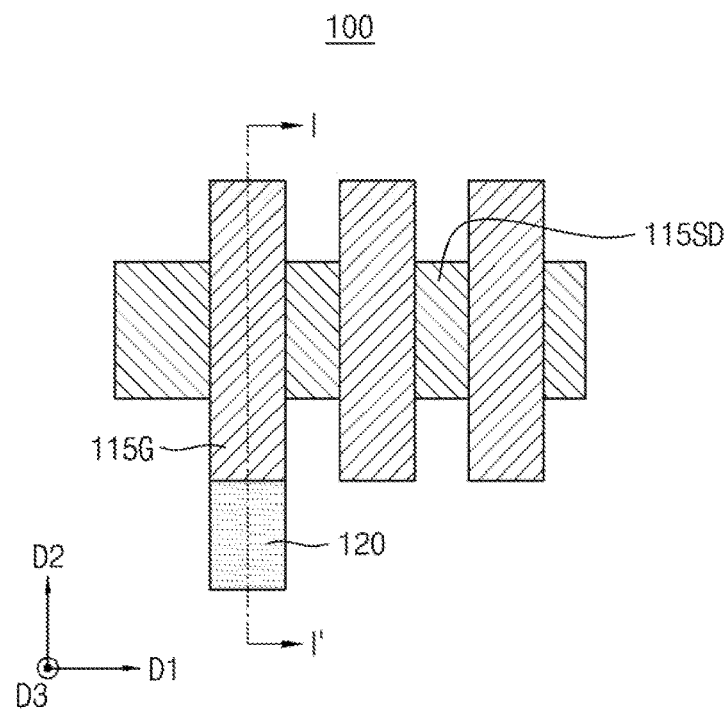
FIG. 1A illustrates a top a plan view of a plurality of multi-stack semiconductor devices in a related art.
Figure 1B:
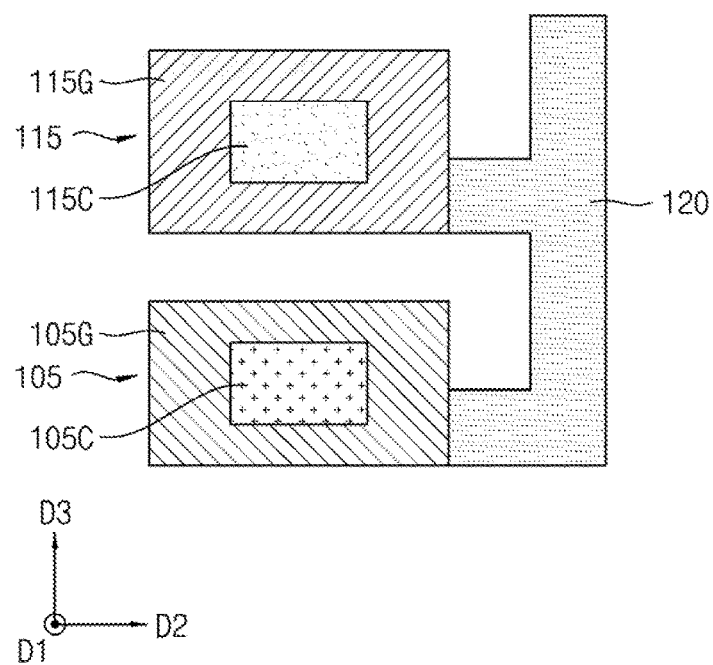
FIG. 1B illustrates a cross-sectional view of the multi-stack semiconductor devices shown in FIG. 1A taken along a line I-I' shown therein.
Figure 2A:
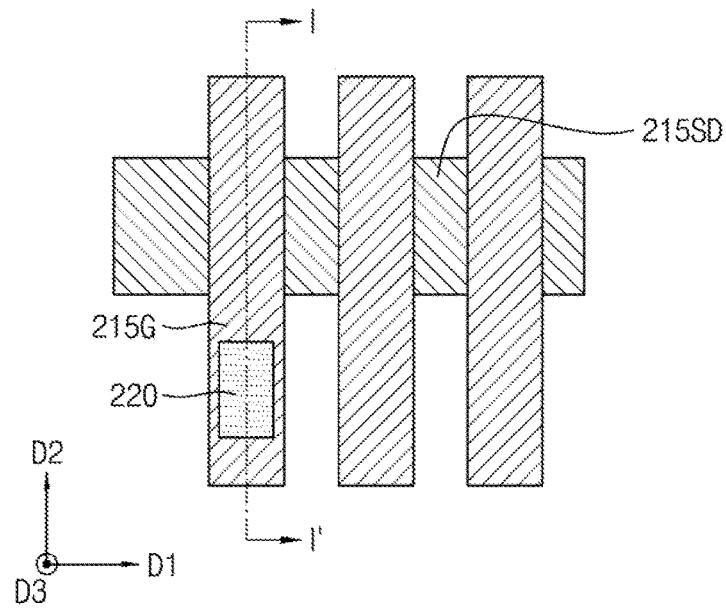
FIG. 2A illustrates a top a plan view of a plurality of different multi-stack semiconductor devices in a related art.
Figure 2B:
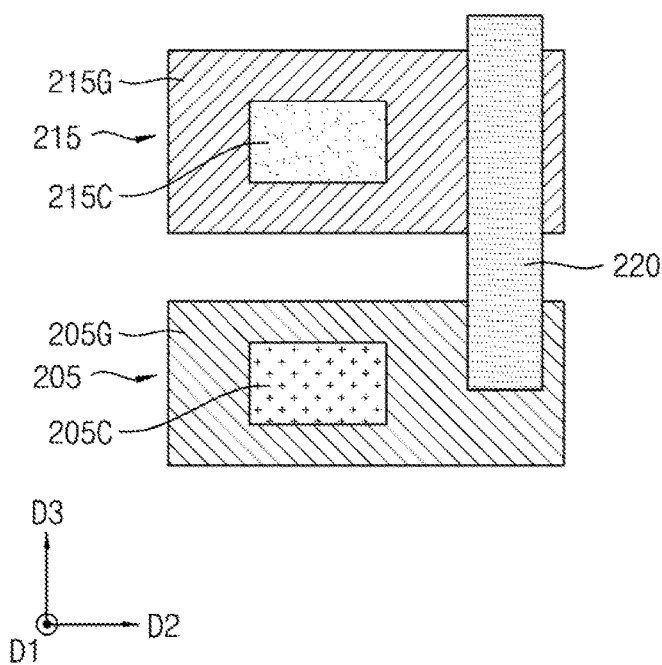
FIG. 2B illustrates a cross-sectional view of the multi-stack semiconductor devices shown in FIG. 2A taken along a line I-I' shown therein.

The embodiments described herein are all example embodiments, and thus, the inventive concept is not limited thereto, and may be realized in various other forms. Each of the embodiments provided in the following description is not excluded from being associated with one or more features of another example or another embodiment also provided herein or not provided herein but consistent with the inventive concept. For example, even if matters described in a specific example or embodiment are not described in a different example or embodiment thereto, the matters may be understood as being related to or combined with the different example or embodiment, unless otherwise mentioned in descriptions thereof. In addition, it should be understood that all descriptions of principles, aspects, examples, and embodiments of the inventive concept are intended to encompass structural and functional equivalents thereof. In addition, these equivalents should be understood as including not only currently well-known equivalents but also equivalents to be developed in the future, that is, all devices invented to perform the same functions regardless of the structures thereof. For example, a multi-stack transistor structure described herein may be implemented by different types of transistors such as nanosheet transistor, fin-field effect transistor (finFET), etc., as long as the inventive concept can be applied thereto.

It will be understood that when an element, component, layer, pattern, structure, region, or so on (hereinafter collectively "element") of a semiconductor device is referred to as being "over," "above," "on," "below," "under," "beneath," "connected to" or "coupled to" another element the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "lower," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, elements described as "below" or "beneath" other elements would then be oriented "above" the other elements. Thus, the term "below" can encompass both an orientation of above and below. The semiconductor device may be otherwise oriented (rotated 90 degrees or at other orientations) and the spatially relative descriptors used herein interpreted accordingly.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

It will be understood that, although the terms first, second, third, fourth etc. may be used herein to describe various elements, these elements should not be limited by these terms. These terms are only used to distinguish one element from another element. Thus, a first element discussed below could be termed a second element without departing from the teachings of the inventive concept.

It will be also understood that, even if a certain step or operation of manufacturing an inventive apparatus or structure is described later than another step or operation, the step or operation may be performed later than the other step or operation unless the other step or operation is described as being performed after the step or operation.

Many embodiments are described herein with reference to cross-sectional illustrations that are schematic illustrations of the embodiments (and intermediate structures). As such, variations from the shapes of the illustrations as a result, for example, of manufacturing techniques and/or tolerances, are to be expected. Thus, the embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept. Further, in the drawings, the sizes and relative sizes of layers and regions may be exaggerated for clarity.

For the sake of brevity, conventional elements of semiconductor devices may or may not be described in detail herein.

Wafer bonding integration is known as one of the most effective methods to form a multi-stack semiconductor device. However, a wafer bonding process has a large degree of process variation in vertically stacking two or more transistor structures. For example, it is known to be very difficult to vertically align two or more transistor structures having a same size of active region and gate structure. Thus, the inventors having also identified difficulties in forming gate contact plugs of the multi-stack semiconductor device as described in reference to FIGS. 1A, 1B, 2A and 2B have developed a principle of intentionally misaligning the upper-stack transistor structure with respect to the lower-stack transistor structure or vice versa in order to effectively achieve an area gain and a simplified manufacturing process in forming a multi-stack semiconductor device, as described below.

Figure 3A:
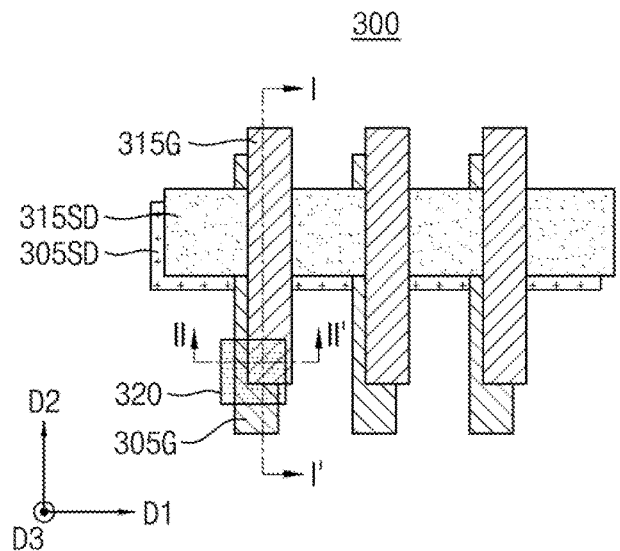
FIG. 3A illustrates a top a plan view of a plurality of multi-stack semiconductor devices according to an embodiment.
Figure 3B:
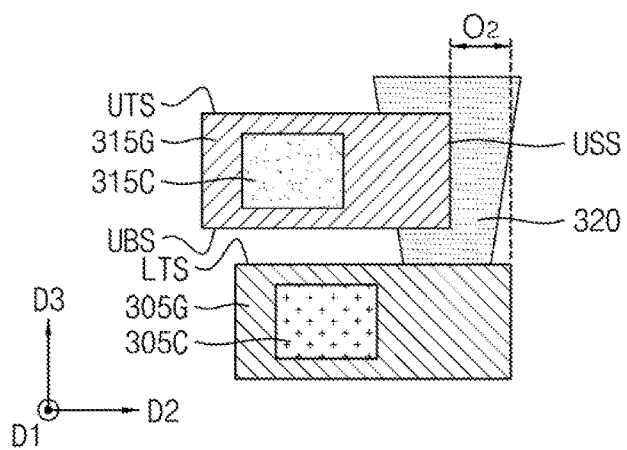
FIG. 3B illustrates a cross-sectional view of the multi-stack semiconductor devices shown in FIG. 3A taken along a line IT shown therein.
Figure 3C:
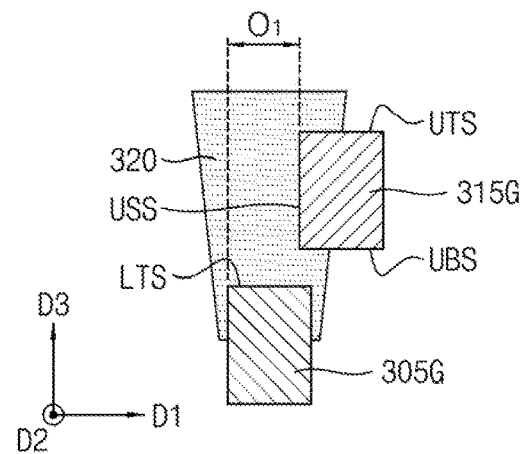
FIG. 3C illustrates a cross-sectional view of the multi-stack semiconductor devices shown in FIG. 3A taken along a line II-II' shown therein.

FIG. 3A illustrates a top a plan view of a plurality of multi-stack semiconductor devices according to an embodiment, FIG. 3B illustrates a cross-sectional view of the multi-stack semiconductor devices shown in FIG. 3A taken along a line I-I' shown therein, and FIG. 3C illustrates a cross-sectional view of the multi-stack semiconductor devices shown in FIG. 3A taken along a line II-II' shown therein.

Referring to FIGS. 3A-3C, a multi-stack semiconductor devices 300 may be arranged on a substrate (not shown) to include a lower-stack transistor structure 305 and an upper-stack transistor structure 315, which may respectively form a lower-stack transistor structure and an upper-stack transistor when completed.

The lower-stack transistor structure 305 may include a lower active region, in which a lower channel structure 305C and lower source/drain regions 305SD are formed, and a lower gate structure 305G surrounding the lower channel structure 305C. Similarly, the upper-stack transistor structure 315 may include an upper active region, in which an upper channel structure 315C and upper source/drain regions 315SD are formed, and an upper gate structure 315G surrounding the upper gate structure 315G.

Further, a gate contact plug 320 may be formed to connect the lower gate structure 305G and the upper gate structure 315G to a power source or another circuit element. For example, such connection to the power source or the other circuit element may be implemented through a back-end-of-line (BEOL) structure (not shown) that may be formed above the upper-stack transistor structure 315, not being limited thereto. It is noted that, in FIG. 3A, the gate contact plug 320 is indicated as being transparent only for the purpose of showing the structural relationship with the two gate structures 305G and 315G in a plan view.

The two gate structures 305G and 315G may also be connected to each other through the gate contact plug 320, so that the two gate structures 305G and 315G form a common gate structure in the multi-stack semiconductor devices 100. Here, the two gate structures 305G and 315G may have a substantially same size in the plan view, according to an embodiment. The two active regions may also have a substantially same size in a plan view, according to an embodiment.

According to an embodiment, the two transistor structures 305 and 315 each may form a p-type transistor or an n-type transistor, or the two transistor structures 305 may form different carrier type transistors, respectively. Thus, the two active regions may include Si or a Si compound doped with n-type dopants (e.g., phosphorus or arsenic) or p-type dopants (e.g., boron or gallium) depending on the type of transistor to be formed from the two transistor structures 305 and 315. The two gate structures 305G and 315G may both include a hafnium (Hf) based high-k dielectric layer and a conductor metal such as tungsten (W) or aluminum (Al) along with a work function metal layer formed of Titanium (Ti), Tantalum (Ta) or their compound. However, the two gate structures 305G and 315G may have a different material composition also depending on the type of transistor to be formed. The gate contact plug 320 may be formed of a conductor metal material such as cobalt (Co), tungsten (W), ruthenium (Ru), or a combination thereof, not being limited thereto. Further, in the above embodiments, the gate contact plug 320 may be formed through chemical vapor deposition (CVD) or flowable CVD (FCVD), not being limited thereto.

It is to be understood here that there may be formed another substrate (wafer) and/or an insulating dielectric layer between the lower-stack transistor structure 305 and the upper-stack transistor structure 315 during a wafer bonding process to manufacture the multi-stack semiconductor devices 300. However, this substrate or the insulating dielectric layer is not shown in FIGS. 3A-3C so that the formation of the two transistor structures 305 and 315 can be easily appreciated.

According to an embodiment, the multi-stack semiconductor device 300 is structured such that the upper-stack transistor structure 315 and the lower-stack transistor structure 305 are formed to be vertically misaligned with each other. In other words, the upper-stack transistor structure 315 does not entirely overlap the lower-stack transistor structure 305 in the vertical direction.

This misalignment of the multi-stack semiconductor device 300 may be obtained by forming either one of the two transistor structures 305 and 315 to have predetermined offsets O1 and O2 with respect to the other one in a D1 direction and a D2 direction which are perpendicular to a D3 direction, which is a vertical direction. Alternatively, the misalignment form of the multi-stack semiconductor device 300 may be obtained by forming each one of the two transistor structures 305 and 315 to have predetermined respective offsets with respect to the other one in the D1 direction and the D2 direction. According to embodiments, the D1 direction may be perpendicular to the D2 direction, or these two directions D1 and D3 may differ from each other by a predetermined degree between 0 to 180.

As at least one of the two transistor structures 305 and 315 is formed to be vertically misaligned with the other one by the respective offsets, the two active regions and the two gate structures 305G and 315G may also be vertically misaligned by the same respective offsets. Thus, FIG. 3A shows that a portion of the lower-stack transistor structure 305 including the lower active region and the lower gate structure 305G is exposed upward in a plan view of the multi-stack semiconductor devices 300, unlike the lower-stack transistor structures 105 and 205 shown in FIGS. 1A and 2A.

As the lower-stack transistor structure 305 and the upper-stack transistor structure 315 are formed in this misalignment form, at least a portion of a top surface LTS of the lower gate structure 305G is able to receive a direct vertical landing of the gate contact plug 320 that passes by the upper gate structure 315G by contacting at least a side surface USS of the upper gate structure 315G as shown FIGS. 3B and 3C. Further, the gate contact plug 320 may also be connected to the upper gate structure 315G at a top surface UTS and a bottom surface UBS thereof. Thus, the gate contact plug 320 may be easily extended from above to be connected to the lower gate structure 305G without much sacrifice of an area gain achieved by the multi-stack semiconductor device 300. Further, this formation and connection of the gate contact plug 320 may be enabled in a relatively simplified process of connecting the gate contact plug 320 to the lower gate structure 305G.

In the present embodiments, the gate contact plug 320 may be connected to both of the lower gate structure 305G and the upper gate structure 315G, by which the two gate structures 305G and 315G are connected to each other. However, depending on a circuit that is to be designed, the gate contact plug 320 may be connected to only the lower gate structure 305G, and another gate contact plug may be connected to the upper gate structure 315G. Still, however, the gate contact plug 320 may directly land on the top surface LTS of the lower gate structure 305G according to an embodiment.

In the present embodiments, the misalignment of the multi-stack semiconductor device 300 may be obtained by forming at least one of the two transistor structures 305 and 315 to have the respective offsets in the D1 direction and the D2 direction as described above, so that the gate contact plug 320 can be easily extended downward to be connected to the top surface LTS of the lower gate structure 305G. However, the misalignment may be achieved by forming only at least one of the lower gate structure 305G and the upper gate structure 315G to have the predetermined offsets O1 and O2 with respect to the other one while the two active regions are not misaligned with each other, according to an embodiment. In this case, only the upper gate structure 315G may overlap the lower gate structure 305G in the D3 direction, while the upper active region may partially overlap the lower active region.

Further, the misalignment may be obtained by forming at least one of the two transistor structures 305 and 315 to have the predetermined offset O1 or O2 with respect to the other one in only one of the D1 direction and the D2 direction, according to the following embodiments.

Figure 4A:
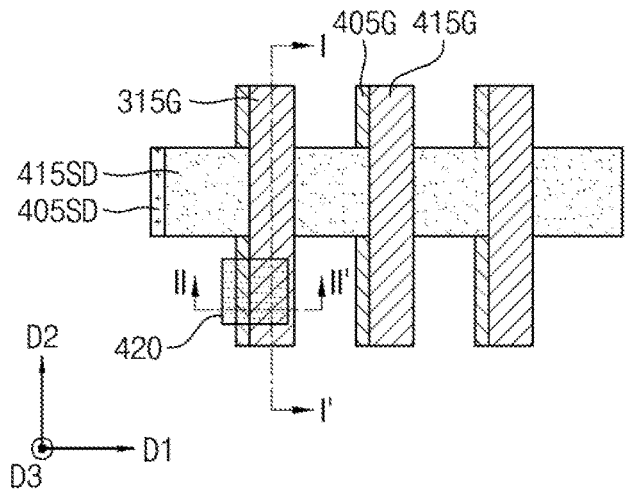
FIG. 4A illustrates a top a plan view of a plurality of multi-stack semiconductor devices according to another embodiment.
Figure 4B:
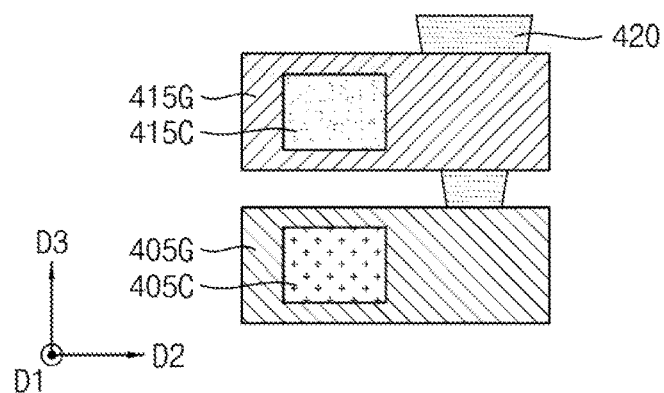
FIG. 4B illustrates a cross-sectional view of the multi-stack semiconductor devices shown in FIG. 4A taken along a line IT shown therein.
Figure 4C:
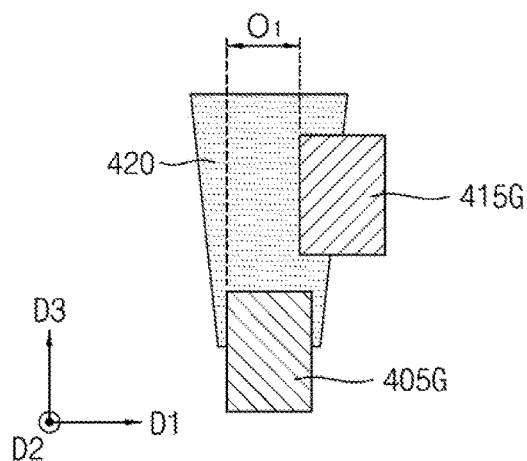
FIG. 4C illustrates a cross-sectional view of the multi-stack semiconductor devices shown in FIG. 4A taken along a line II-II' shown therein.

FIG. 4A illustrates a top a plan view of a plurality of multi-stack semiconductor devices according to another embodiment, FIG. 4B illustrates a cross-sectional view of the multi-stack semiconductor devices shown in FIG. 4A taken along a line I-I' shown therein, and FIG. 4C illustrates a cross-sectional view of the multi-stack semiconductor devices shown in FIG. 4A taken along a line II-II' shown therein.

Referring to FIGS. 4A-4C, a lower-stack transistor structure 405 and an upper-stack transistor structure 415 forming a multi-stack semiconductor devices 400 respectively may include the same elements included in the lower-stack transistor structure 305 and the upper-stack transistor structure 315 shown in FIGS. 3A-3C. Thus, a lower active region including a lower channel structure 405C, lower source/drain regions 405SD, a lower gate structure 405G, an upper active region including an upper channel structure 415C and upper source/drain regions 415SD, an upper gate structure 415G, and a gate contact plug 420 may be the same as the corresponding elements included in the multi-stack semiconductor devices 300 except their positions with respect to the those of the corresponding elements of the multi-stack semiconductor device 300.

According to an embodiment, the upper-stack transistor structure 415 is formed to be vertically misaligned with respect to the lower-stack transistor structure 405 in the D1 direction, but not in the D2 direction. Thus, at least the upper gate structure 415G is formed to have the predetermined offset O1 with respect to the lower gate structure 405G in the D1 direction. Accordingly, similar to the gate contact plug 320, the gate contact plug 420 may be able to directly land on a top surface of the lower gate structure 405G due to the misalignment.

Figure 5A:
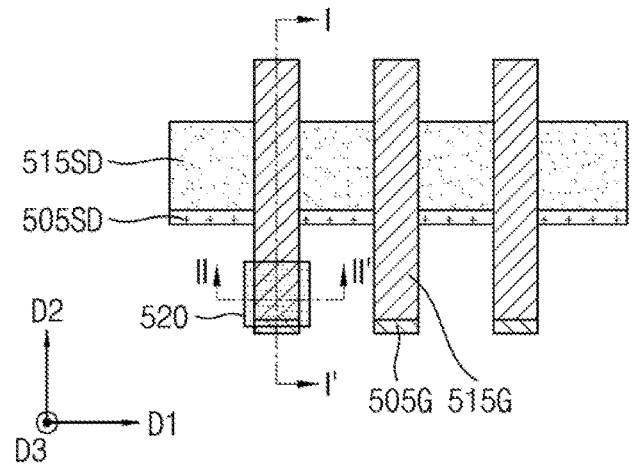
FIG. 5A illustrates a top a plan view of a plurality of multi-stack semiconductor devices according to still another embodiment.
Figure 5B:
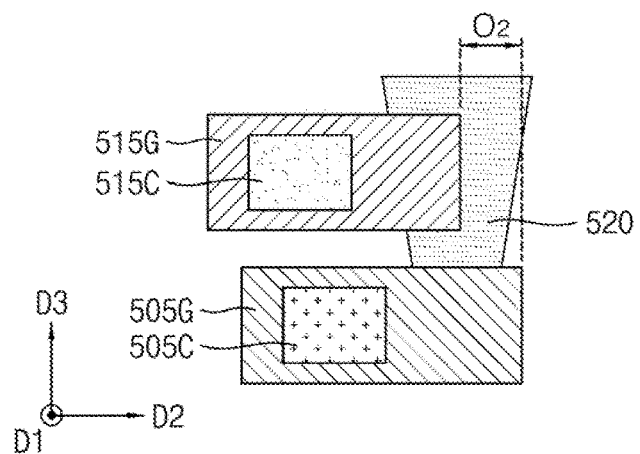
FIG. 5B illustrates a cross-sectional view of the multi-stack semiconductor devices shown in FIG. 5A taken along a line IT shown therein.
Figure 5C:
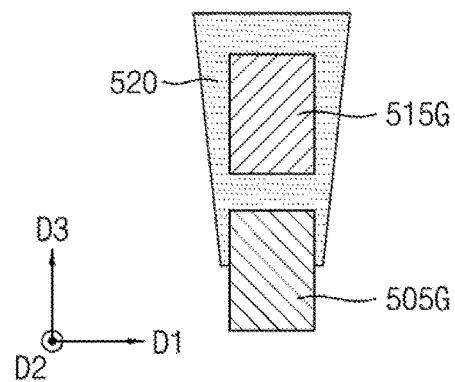
FIG. 5C illustrates a cross-sectional view of the multi-stack semiconductor devices shown in FIG. 5A taken along a line II-II' shown therein.

FIG. 5A illustrates a top a plan view of a plurality of multi-stack semiconductor devices according to still another embodiment, FIG. 5B illustrates a cross-sectional view of the multi-stack semiconductor devices shown in FIG. 5A taken along a line IT shown therein, and FIG. 5C illustrates a cross-sectional view of the multi-stack semiconductor devices shown in FIG. 5A taken along a line II-II' shown therein.

Referring to FIGS. 5A-5C, a lower-stack transistor structure 505 and an upper-stack transistor structure 515 forming a multi-stack semiconductor devices 500 respectively may include the same elements included in the lower-stack transistor structure 305 and the upper-stack transistor structure 315 shown in FIGS. 3A-3C. Thus, a lower active region including a lower channel structure 405C, lower source/drain regions 505SD, a lower gate structure 505G, an upper active region including an upper channel structure 515C and upper source/drain regions 515SD, an upper gate structure 515G, and a gate contact plug 520 may be the same as the corresponding elements included in the multi-stack semiconductor devices 300 except their positions with respect to the those of the corresponding elements of the multi-stack semiconductor device 500.

According to an embodiment, the upper-stack transistor structure 515 is formed to be vertically misaligned with respect to the lower-stack transistor structure 505 in the D2 direction, but not in the D1 direction.2 Thus, at least the upper gate structure 515G is formed to have the predetermined offset O2 with respect to the lower gate structure 5405G in the D direction. Accordingly, similar to the gate contact plug 320, the gate contact plug 520 may be able to directly land on a top surface of the lower gate structure 505G due to the misalignment.

It is noted, however, any one of the above embodiments may enable the gate contact plug to land on at least the top surface of the lower gate structure in the corresponding multi-stack semiconductor device without sacrificing an area gain achieved by the multi-stack semiconductor device in a simplified process of forming the gate contact plug.

In the above embodiments, each of the lower channel structure and the upper channel structure in the corresponding multi-stack semiconductor device may be a plurality nanosheet layers so that the multi-stack semiconductor device may include a lower-stack nanosheet transistor and an upper-stack nanosheet transistor. However, the disclosure is not limited thereto, and thus, a different type of channel structure other than the nanosheet layers may be formed form the lower-stack transistor structure and the upper-stack transistor structure of the multi-stack semiconductor device, according to an embodiment. Further, different types of channel structures may be formed for the lower-stack transistor structure and the upper-stack transistor structure, respectively, to form the multi-stack semiconductor device, according to embodiments. For example, the upper channel structure may include at least one fin structure forming a finFET as the upper-stack transistor structure, while the lower channel structure may include a plurality nanosheet layers forming a nanosheet transistor as the lower-stack transistor structure.

It is also noted that the above embodiment may apply to a multi-stack semiconductor device having one or more additional-stack transistor structures on the upper-stack transistor structure and the lower-stack transistor structure.

Figure 6:
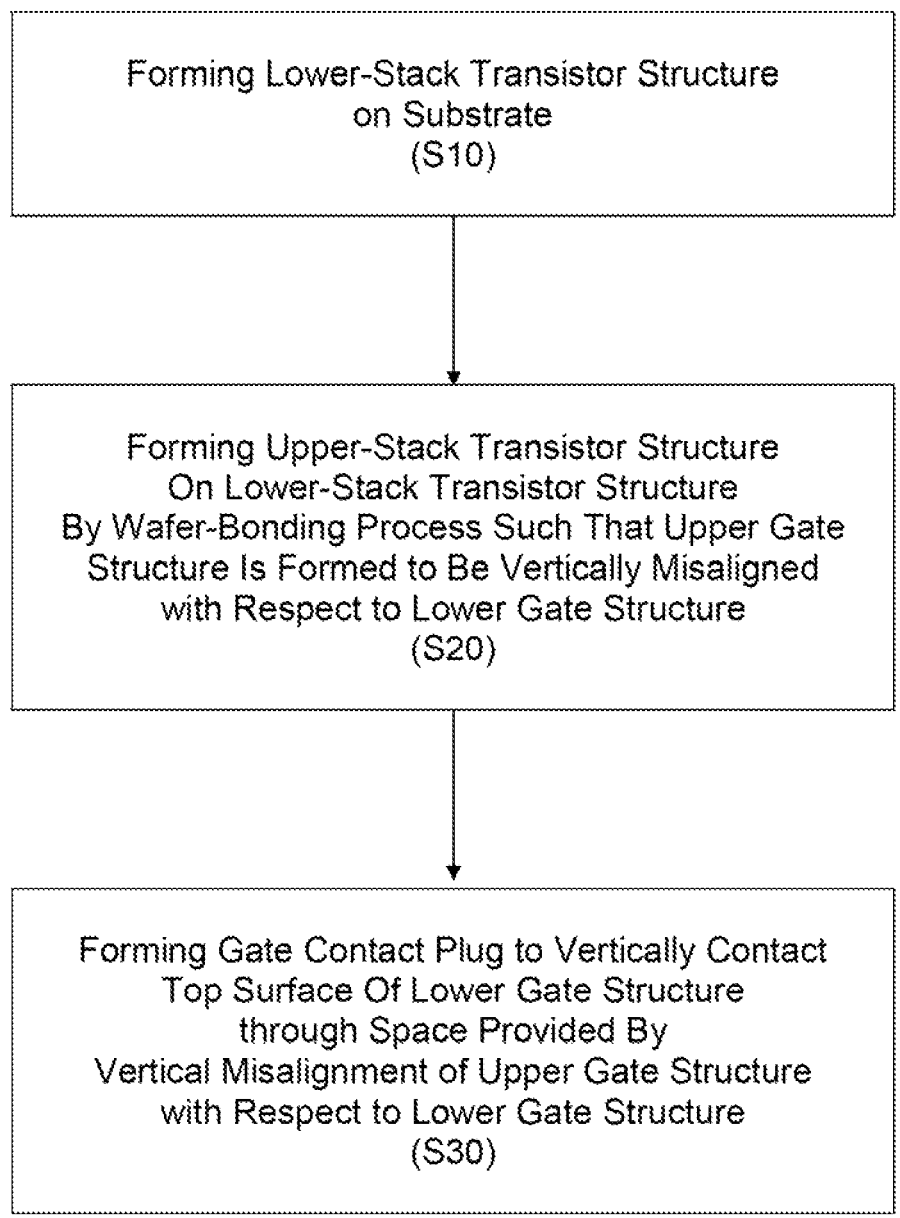
FIG. 6 illustrate a method of manufacturing a multi-stack semiconductor device, according to embodiments.

FIG. 6 illustrate a method of manufacturing a multi-stack semiconductor device, according to embodiments.

In operation S10, a lower-stack transistor structure is provided. The lower-stack transistor structure may include a lower active region, in which a lower channel structure and lower source/drain regions are formed, and a lower gate structure surrounding the lower channel structure.

In operation S20, an upper-stack transistor structure may be formed on the lower-stack transistor structure provided in the previous operation by a wafer-bonding process. Thus, the upper-stack transistor may be vertically stacked on the lower-stack transistor structure with a substrate (wafer) interposed therebetween. The upper-stack transistor structure may include an upper active region, in which an upper channel structure and upper source/drain regions are formed, and an upper gate structure surrounding the upper gate structure on another substrate (wafer). It is noted here that at least the lower gate structure and the upper gate structure may have a substantially same size in a plan view.

When the upper-stack transistor structure is formed through a wafer bonding process in operation S20, at least the upper gate structure is formed to be vertically misaligned with respect to the lower gate structure. Thus, the upper gate structure does not entirely overlap the lower gate structure in a vertical direction, and instead, the upper gate structure is formed to have a predetermined offset(s) with respect to the lower gate structure in at least one of the D1 direction and the D2 direction in the plan view. At this time, the upper active region may also be formed to be vertically misaligned with respect to the lower active region to have the same predetermined offsets in at least one of the two directions in the plan view.

In operation S30, a gate contact plug may be formed to vertically contact a top surface of the lower gate structure through a space provided by the vertical misalignment of the two gate structures. The gate contact plug may be formed also to contact a top surface, a side surface and a bottom surface of the upper gate structure as shown in FIG. 3B.

It is noted here that the above-described intentional misalignment between the two transistor structures enables the gate contact plug to make the direct vertical landing on the top surface of the lower gate structure even when a manufacturing variation occurs during the wafer bonding process for the multi-stack semiconductor device.

Figure 7:
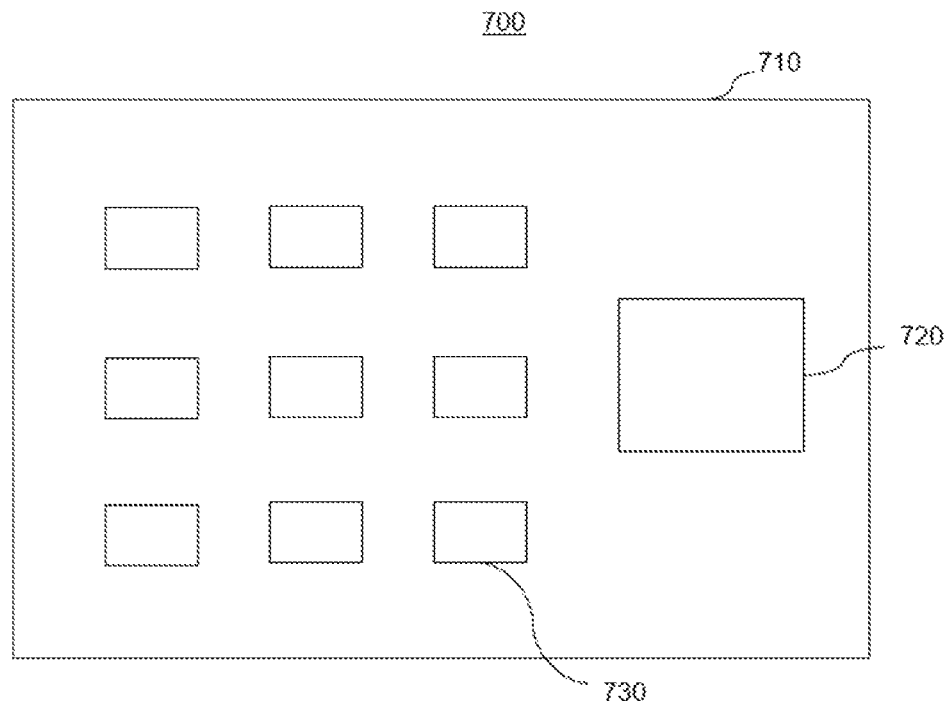
FIG. 7 illustrates a schematic a plan view of a semiconductor module including a multi-stack semiconductor device, according to an embodiment.

FIG. 7 illustrates a schematic a plan view of a semiconductor module according to an embodiment.

Referring to FIG. 7, a semiconductor module 700 according to an embodiment may include a processor 720 and semiconductor devices 730 that are mounted on a module substrate 710. The processor 720 and/or the semiconductor devices 730 may include one or more multi-stack semiconductor devices described in the above embodiments.

Figure 8:
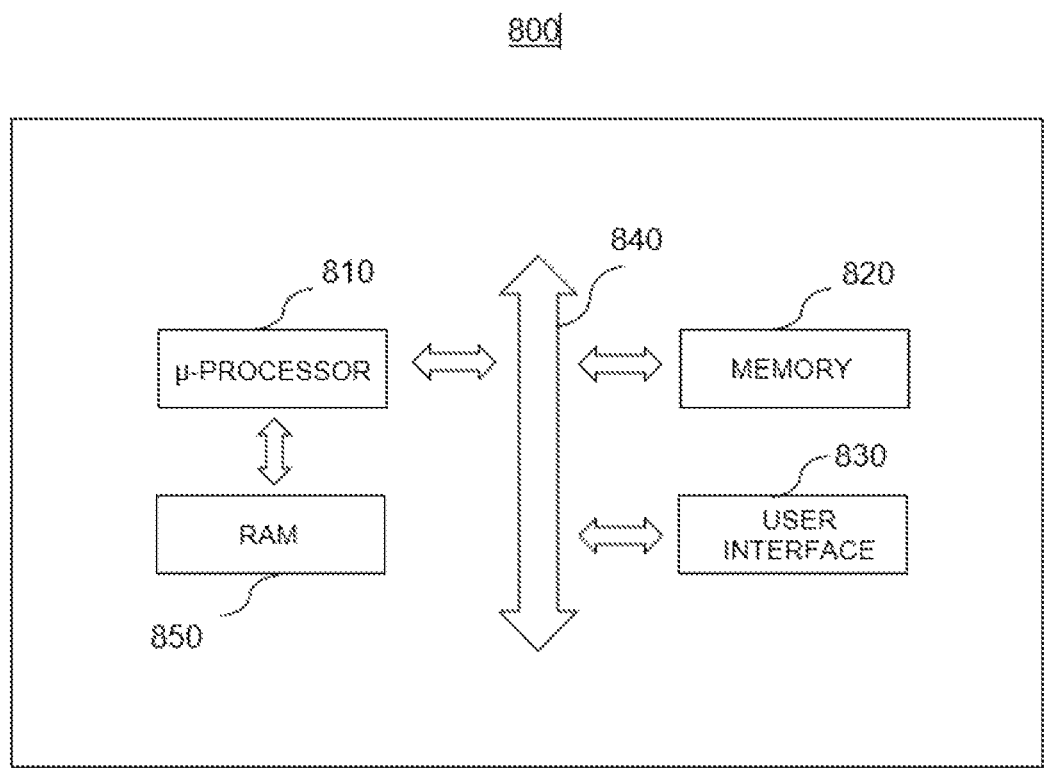
FIG. 8 illustrates a schematic a plan view of an electronic system including a multi-stack semiconductor device, according to an embodiment.

FIG. 8 illustrates a schematic block diagram of an electronic system according to an embodiment.

Referring to FIG. 8, an electronic system 800 in accordance with an embodiment may include a microprocessor 810, a memory 820, and a user interface 8530 that perform data communication using a bus 840. The microprocessor 810 may include a central processing unit (CPU) or an application processor (AP). The electronic system 800 may further include a random access memory (RAM) 850 in direct communication with the microprocessor 8510. The microprocessor 8510 and/or the RAM 850 may be implemented in a single module or package. The user interface 830 may be used to input data to the electronic system 800, or output data from the electronic system 800. For example, the user interface 830 may include a keyboard, a touch pad, a touch screen, a mouse, a scanner, a voice detector, a liquid crystal display (LCD), a micro light-emitting device (LED), an organic light-emitting diode (OLED) device, an active-matrix light-emitting diode (AMOLED) device, a printer, a lighting, or various other input/output devices without limitation. The memory 820 may store operational codes of the microprocessor 810, data processed by the microprocessor 810, or data received from an external device. The memory 820 may include a memory controller, a hard disk, or a solid state drive (SSD).

At least the microprocessor 810, the memory 820 and/or the RAM 850 in the electronic system 800 may include one or more multi-stack semiconductor device described in the above embodiments. Although not shown in FIG. 8, the electronic system may further include one or more different types of processor other than the microprocessor 810, and the one or more different processors may also include at least one multi-stack semiconductor device described in the above embodiments.

The foregoing is illustrative of exemplary embodiments and is not to be construed as limiting thereof. Although a few exemplary embodiments have been described, those skilled in the art will readily appreciate that many modifications are possible in the above embodiments without materially departing from the inventive concept.

What is claimed is:

1. A multi-stack semiconductor device comprising:
a lower-stack transistor structure comprising a lower active region and a lower gate structure, the lower active region comprising a lower channel structure, and the lower gate structure surrounding the lower channel structure;
an upper-stack transistor structure vertically stacked above the lower-stack transistor structure, and comprising an upper active region and an upper gate structure, the upper active region comprising an upper channel structure, and the upper gate structure surrounding the upper channel structure; and
at least one gate contact plug contacting the upper gate structure and a top surface of the lower gate structure,
wherein the lower gate structure and the upper gate structure have a substantially same size in a plan view, and
wherein the lower gate structure is not entirely overlapped by the upper gate structure in a vertical direction.

2. The multi-stack semiconductor device of claim 1, wherein the gate contact plug contacts a side surface of the upper gate structure.

3. The multi-stack semiconductor device of claim 2, wherein the gate contact plug connects the lower gate structure to the upper gate structure at an outside of the lower active region and the upper active region in the plan view.

4. The multi-stack semiconductor device of claim 1, wherein the lower active region and the upper active region have a same size in a plan view.

5. The multi-stack semiconductor device of claim 4, wherein the lower active region is not entirely vertically overlapped by the upper active region.

6. The multi-stack semiconductor device of claim 5, wherein the gate contact plug contacts a side surface of the upper gate structure.

7. The multi-stack semiconductor device of claim 6, wherein the gate contact plug connects the lower gate structure to the upper gate structure at an outside of the lower active region and the upper active region in the plan view.

8. The multi-stack semiconductor device of claim 1, wherein the lower-stack transistor structure comprises a plurality of lower nanosheet layers as the lower channel structure, and
wherein the upper-stack transistor structure comprises a plurality of upper nanosheet layers as the upper channel structure or a different type of channel structure.

9. The multi-stack semiconductor device of claim 8, wherein the lower active region is not entirely overlapped by the upper active region in the vertical direction.

10. The multi-stack semiconductor device of claim 9, wherein the gate contact plug contacts a side surface of the upper gate structure.

11. The multi-stack semiconductor device of claim 10, wherein the gate contact plug connects the lower gate structure to the upper gate structure at an outside of the lower active region and the upper active region in the plan view.

12. The multi-stack semiconductor device of claim 1, wherein the lower-stack transistor structure comprises a plurality of lower nanosheet layers as the lower channel structure, and
wherein the upper-stack transistor structure comprises a plurality of fin structures as the upper channel structure to form a fin-field effect transistor (finFET).

13. The multi-stack semiconductor device of claim 12, wherein the lower active region is not entirely overlapped by the upper active region in the vertical direction.

14. The multi-stack semiconductor device of claim 13, wherein the gate contact plug contacts a side surface of the upper gate structure, and
wherein the gate contact plug connects the lower gate structure to the upper gate structure at an outside of the lower active region and the upper active region in the plan view.

15. A multi-stack semiconductor device comprising:
a lower-stack transistor structure comprising a lower active region and a lower gate structure, the lower active region comprising a lower channel structure, and the lower gate structure surrounding the lower channel structure;
an upper-stack transistor structure vertically stacked above the lower-stack transistor structure, and comprising an upper active region and an upper gate structure, the upper active region comprising an upper channel structure, and the upper gate structure surrounding the upper channel structure;
at least one gate contact plug contacting a top surface of the lower gate structure,
wherein the lower gate structure and the upper gate structure have a same size in a plan view, and
wherein the upper gate structure is formed to have a predetermined offset with respect to the lower gate structure in at least one of a first direction and a second direction in the plan view, the first direction and the second direction being perpendicular to a vertical direction.

16. The multi-stack semiconductor device of claim 15, wherein the upper gate structure is formed to have the predetermined offset only in the first direction among the first direction and the second direction.

17. The multi-stack semiconductor device of claim 16, wherein the upper active region is formed to have the predetermined offset with respect to the lower active region in the at least one of the first direction and the second direction in the plan view.

18. The multi-stack semiconductor device of claim 16, wherein the gate contact plug contacts a side surface of the upper gate structure, and
wherein the gate contact plug connects the lower gate structure to the upper gate structure at an outside of the lower active region and the upper active region in the plan view.

19. The multi-stack semiconductor device of claim 18, wherein the lower-stack transistor structure comprises a plurality of lower nanosheet layers as the lower channel structure, and
wherein the upper-stack transistor structure comprises a plurality of upper nanosheet layers as the upper channel structure or a different type of channel structure.

20. A method of forming a multi-stack semiconductor device, the method comprising:
forming a lower-stack transistor structure comprising a lower active region and a lower gate structure;
forming an upper-stack transistor structure, comprising an upper active region and an upper gate structure, on the lower-stack transistor structure with a substrate interposed such that the upper gate structure is formed to have a predetermined offset with respect to the lower gate structure in at least one of a first direction and a second direction in a plan view, the first direction and the second direction being perpendicular to a vertical direction; and
connecting a gate contact plug directly on a top surface of the lower gate structure through a space provided by the predetermined offset between the lower gate structure and the upper gate structure.

* * * * *